United States Patent
Park et al.

(10) Patent No.: US 11,146,292 B2
(45) Date of Patent: Oct. 12, 2021

(54) DATA DECODING APPARATUS AND METHOD

(71) Applicant: AGENCY FOR DEFENSE DEVELOPMENT, Daejeon (KR)

(72) Inventors: Cheolsun Park, Daejeon (KR); Chiho Lee, Daejeon (KR); Unseob Jeong, Daejeon (KR); Dongyeong Kim, Seoul (KR); Junghwan Song, Seoul (KR); Dongweon Yoon, Seoul (KR)

(73) Assignee: AGENCY FOR DEFENSE DEVELOPMENT

( * ) Notice: Subject to any disclaimer, the term of this patent is extended or adjusted under 35 U.S.C. 154(b) by 0 days.

(21) Appl. No.: 16/722,294

(22) Filed: Dec. 20, 2019

(65) Prior Publication Data
US 2021/0184698 A1 Jun. 17, 2021

(30) Foreign Application Priority Data
Dec. 13, 2019 (KR) .................. 10-2019-0167172

(51) Int. Cl.
*H03M 13/15* (2006.01)
*H03M 13/29* (2006.01)
*H03M 13/11* (2006.01)

(52) U.S. Cl.
CPC ..... *H03M 13/151* (2013.01); *H03M 13/1108* (2013.01); *H03M 13/2903* (2013.01); *H03M 13/2975* (2013.01)

(58) Field of Classification Search
CPC ................ H04J 13/0007; H03M 13/2739
See application file for complete search history.

(56) References Cited

U.S. PATENT DOCUMENTS

| | | | | |
|---|---|---|---|---|
| 6,389,138 B1* | 5/2002 | Li | ............ | H04B 1/707 370/209 |
| 6,731,670 B1* | 5/2004 | Kido | ............ | H03K 3/84 375/140 |
| 7,362,867 B1* | 4/2008 | Kim | ............ | H03K 3/84 380/275 |

FOREIGN PATENT DOCUMENTS

| KR | 10-0876442 B1 | 12/2008 |
|---|---|---|
| KR | 10-1000780 B1 | 12/2010 |
| KR | 10-1086347 B1 | 11/2011 |
| KR | 10-1171373 B1 | 8/2012 |

OTHER PUBLICATIONS

Applicant's Search Report dated Oct. 24, 2019.

* cited by examiner

*Primary Examiner* — Joseph D Torres
(74) *Attorney, Agent, or Firm* — Ostrolenk Faber LLP

(57) ABSTRACT

A data decoder includes a communication unit receiving a bit signal with encoded data; a first operation unit that bit shifts the bit signal by a first length, corresponding to a length of a spreading code used to encode the data, to generate a first operation stream; a second operation unit generating a second operation stream without the spreading code; a third operation unit that bit shifts the second operation stream by a second length to generate a third operation stream; a fourth operation unit generating a fourth operation stream from which the data is removed using the second operation stream and the third operation stream; and a polynomial generator that decodes the encoded data using the fourth operation stream.

6 Claims, 2 Drawing Sheets

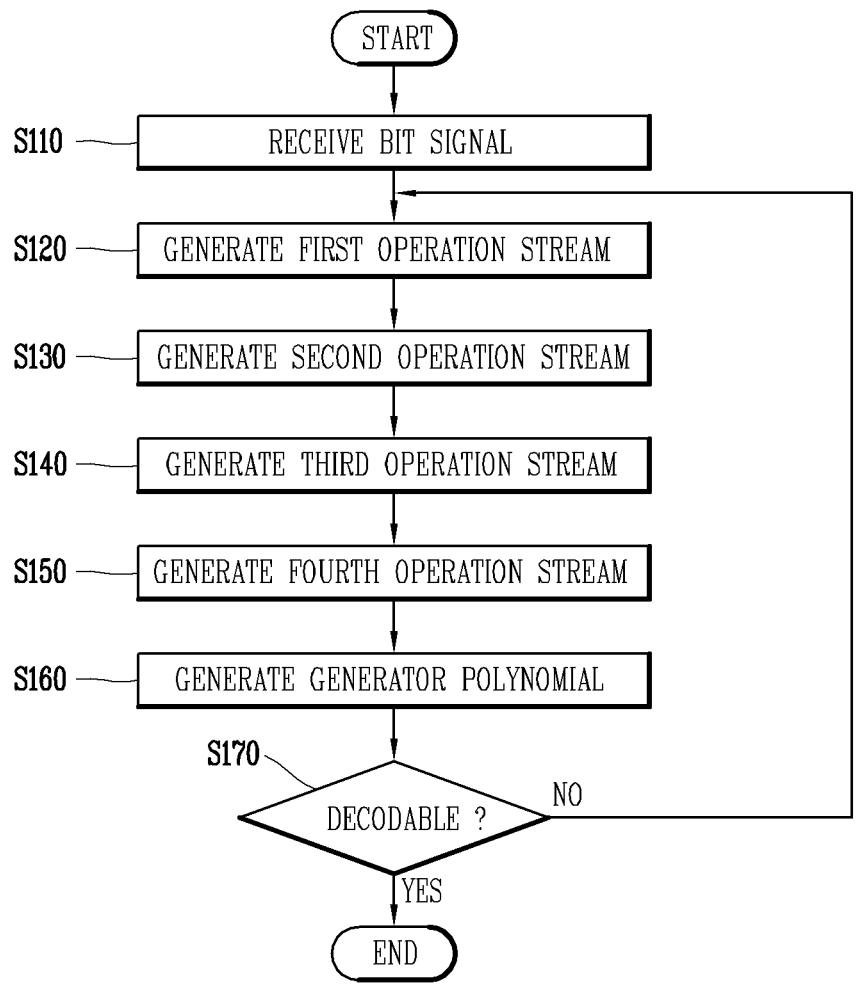
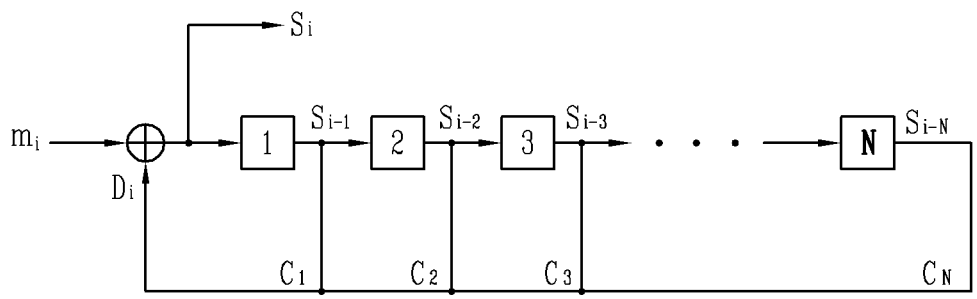

DATA DECODING APPARATUS AND METHOD

CROSS-REFERENCE TO RELATED APPLICATION

Pursuant to 35 U.S.C. § 119(a), this application claims the benefit of an earlier filing date of and the right of priority to Korean Patent Application No. 10-2019-0167172, filed on Dec. 13, 2019, the contents of which are incorporated by reference herein in its entirety.

BACKGROUND

1. Technical Field

The present disclosure relates to a data decoding apparatus and method for decoding an unknown bitstream of encoded data.

2. Description of the Related Art

In general, in a data communication process, a transmitting apparatus scrambles a bit block consisting of data to be transmitted using a scrambling sequence or a generator polynomial, and then transmits it to a receiving apparatus through a modulation process.

The receiving apparatus must descramble the data bit block acquired through a demodulation process of a received signal using the same scrambling sequence or generator polynomial as used in the transmitting apparatus.

The scrambling process is performed to randomize the effect of interference signals on the data bit block, and for the descrambling process, the transmitting apparatus and the receiving apparatus must share the same scrambling sequence or the generator polynomial information.

In order to descramble the scrambled bit block, a generator polynomial used for scrambling is required. However, descrambling is not possible because the generator polynomial used for scrambling is not known upon receiving an unknown bitstream, and as a result, a method for estimating the generator polynomial is required.

SUMMARY

An aspect of the present disclosure is to provide a data decoding apparatus and method capable of decoding encoded data by deriving a generator polynomial used in an unknown bitstream.

In order to achieve the foregoing objectives, a data decoding apparatus according to an aspect may include a communication unit configured to receive a bit signal with encoded data; a first operation unit configured to perform a bit shift on the bit signal by a first length corresponding to a length of a spreading code used to encode the data so as to generate a first operation stream; a second operation unit configured to generate a second operation stream from which the spreading code is removed using the bit signal and the first operation stream; a third operation unit configured to perform a bit shift on the second operation stream by a second length to generate a third operation stream; a fourth operation unit configured to generate a fourth operation stream from which the data is removed using the second operation stream and the third operation stream; and a polynomial generator configured to generate a generator polynomial capable of decoding the data encoded using the fourth operation stream.

Furthermore, the data decoding apparatus may further include a determination unit configured to decode the bit signal using the generator polynomial and determine whether or not it is decodable.

In addition, the first operation unit and the third operation unit may perform a bit shift through a left shift operator.

Furthermore, the first length may be any one of a plurality of lengths available for the spreading code, and the second length may be a natural number equal to or greater than 1.

In addition, the second operation unit may perform an exclusive OR operation between the bit signal and the first operation stream to remove the spreading code, and the fourth operation unit may perform an exclusive OR operation between the second operation stream and the third operation stream to remove the message.

On the other hand, in order to achieve the foregoing objectives, a data decoding method according to another aspect of the present disclosure may is include receiving a bit signal with encoded data; performing a bit shift on the bit signal by a first length corresponding to a length of a spreading code used to encode the data so as to generate a first operation stream; generating a second operation stream from which the spreading code is removed using the bit signal and the first operation stream; performing a bit shift on the second operation stream by a second length to generate a third operation stream; generating a fourth operation stream from which the data is removed using the second operation stream and the third operation stream; and generating a generator polynomial capable of decoding the data encoded using the fourth operation stream.

Furthermore, the method may further include decoding the bit signal using the generator polynomial, and determining whether or not it is decodable.

Said determining whether or not the bit signal is decodable may perform generating the first operation stream if it is determined that the bit signal is undecodable by the generator polynomial.

In addition, said generating first operation unit and said generating the third operation unit may perform a bit shift through a left shift operator.

Here, the first length may be any one of a plurality of lengths available for the spreading code, and the second length is a natural number equal to or greater than 1.

Furthermore, said generating the second operation stream may perform an exclusive OR operation between the bit signal and the first operation stream to remove the spreading code, and said generating the fourth operation stream may perform an exclusive OR operation between the second operation stream and the third operation is stream to remove the message.

According to a data decoding apparatus and method according to an embodiment of the present disclosure, first, a generator polynomial may be derived without knowing the type and length of a spreading code used to encode an unknown bit signal.

Second, an encoded message may be decoded using the derived generator polynomial.

BRIEF DESCRIPTION OF THE DRAWINGS

FIG. 2 is a flowchart for explaining a data decoding method according to an embodiment of the present disclosure.

FIG. 3 is a block diagram schematically illustrating a structure of a self-synchronizing scrambler.

DETAILED DESCRIPTION OF THE EMBODIMENTS

Figure 1:
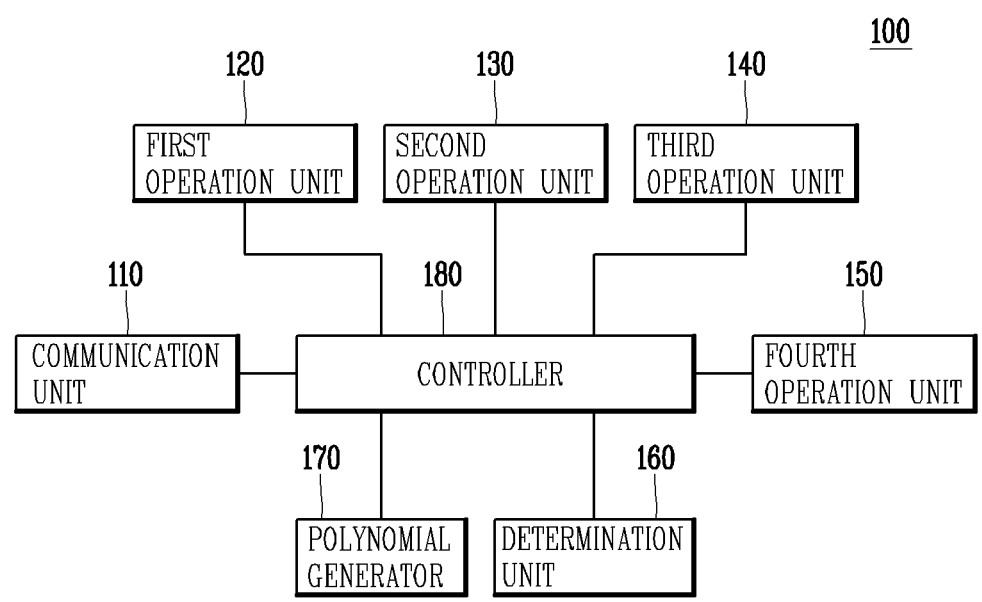
FIG. 1 is a block diagram schematically illustrating a data decoding apparatus according to an embodiment of the present disclosure.

Hereinafter, a preferred embodiment of the present disclosure will be described in detail with reference to the accompanying drawings. Here, it is noted that the same components in the accompanying drawings are represented by the same reference numerals as much as possible. In addition, the detailed descriptions of well-known functions and configurations that may obscure the gist of the present disclosure will be omitted. For the same reason, in the accompanying drawings, some components are exaggerated, omitted or schematically illustrated.

FIG. 1 is a block diagram schematically illustrating a data decoding apparatus according to an embodiment of the present disclosure.

Referring to FIG. 1, the present disclosure relates to a decoding apparatus 100 for deriving a generator polynomial used to generate a bit signal so as to decode a bit signal having data encoded with a self-synchronizing scrambler, and decoding the data using the derived generator polynomial.

The data decoding apparatus 100 of the present disclosure includes a communication unit 110, a first operation unit 120, a second operation unit 130, a third operation unit 140, a fourth operation unit 150, a polynomial generator 160, and a determination unit 170.

The communication unit 110 receives a bit signal with encoded data.

The first operation unit 120 performs a bit shift on the bit signal by a first length corresponding to the number of bits of a spreading code used to encode the data so as to generate a first operation stream.

Here, the first operation unit 120 performs a left shift operation to bit-shift the bit signal.

Furthermore, the first length is any one of a plurality of lengths available for the spreading code.

For example, a Barker code may be generated with 2, 3, 4, 5, 7, 11 and 13 bits.

Therefore, if a spreading code used to encode a message is a Barker code, then the first length may be any one of 2, 3, 4, 5, 7, 11 and 13.

The second operation unit 130 generates a second operation stream in which the spreading code is removed using the bit signal and the first operation stream.

Here, the second operation unit 130 performs an XOR operation on the bit signal and the first operation stream to remove the spreading code used to encode the data.

Furthermore, the third operation unit 140 performs a bit shift on the second operation stream by a second length to generate a third operation stream.

Here, the third operation unit 140 may perform a left shift operation to perform a bit shift, and the second length may be a natural number equal to or greater than 1.

The fourth operation unit 150 generates a fourth operation stream in which the data is removed using the second operation stream and the third operation stream.

Here, the fourth operation unit 150 performs an XOR operation on the second operation stream and the third operation stream to remove the data.

The polynomial generator 160 generates a generator polynomial capable of decoding data using the fourth operation stream.

The polynomial generator 160 represents the fourth operation stream as a simultaneous equation consisting of linear equations for coefficients of the generator polynomial, converts the simultaneous equation into a matrix, and then applies a Gaussian elimination method to extract the coefficients of the generator polynomial.

Furthermore, the generator polynomial is generated using the extracted coefficients.

In addition, the polynomial generator 160 may derive an initial value of the scrambler as well as generating the generator polynomial.

The determination unit 170 decodes the bit signal using the generator polynomial, and determines whether or not it is decodable.

Data encoded in the bit signal is extracted if it is determined by the determination unit 170 that the bit signal is decodable by the generator polynomial, but the operation is repeated from the process of generating the first operation stream by the first operation unit 120 if the bit signal is not decoded.

Here, the first operation unit 120 generates the first operation stream with a different number of bits of the spreading code.

Then, the controller 180 controls an overall operation of the data decoding apparatus 100.

FIG. 2 is a flowchart for explaining a data decoding method according to an embodiment of the present disclosure.

Referring to FIGS. 1 and 2, according to a data decoding method of the present disclosure, the communication unit 110 receives a bit signal with encoded data (step S110).

Then, the first operation unit 120 performs a bit shift on the bit signal by a first length corresponding to the number of bits of a spreading code used to encode the data so as to generate a first operation stream (step S120).

In step S120, the bit shift is performed by a left shift operation, and the to first length is any one of a plurality of bits available for the spreading code.

For example, a Barker code, which is a representative spreading code, may be generated with lengths of 2, 3, 4, 5, 7, 11, and 13 bits.

If the spreading code used to encode a message is a Barker code, the first length may be any one of 2, 3, 4, 5, 7, 11 and 13.

Subsequently, the second operation unit 130 generates a second operation stream in which the spreading code is removed using the bit signal and the first operation stream (step S130), and the third operation unit 140 performs bit shift on the second operation stream by a second length to generate a third operation stream (step S140).

In operation S130, the second operation stream is generated by an exclusive OR operation between the bit signal and the first operation stream, and the spreading code is removed in this process.

In step S140, the bit shift is performed by a left shift operation, and the second length may be a natural number equal to or greater than 1.

Furthermore, when the fourth operation unit 150 generates a fourth operation stream in which data is removed using the second operation stream and the third operation stream (step S150), the polynomial generator 160 generates a generator polynomial capable of decoding encoded data (step S160).

In operation S150, the fourth operation stream is generated by an exclusive OR operation between the second operation stream and the third operation stream, and the data is removed in this process.

Additionally, in step S160, an initial value of the scrambler may also be extracted.

Subsequently, the determination unit 170 decodes the bit signal using the generator polynomial generated in step S160, and determines whether or not it is decodable (step S170).

Data contained in the bit signal is recovered if it is determined in step S170 that the bit signal is decodable, but the operation returns to the step S120 to repeat the steps S120, S130, S140, S150, and S160 with a different number of bits of the spreading code if determined that the bit signal is not decodable through the generator polynomial.

FIG. 3 is a block diagram schematically illustrating a structure of a self-synchronizing scrambler.

Referring to FIG. 3, the process of deriving a generator polynomial of a bit signal encoded with a self-synchronizing scrambler will be described.

The self-synchronizing scrambler has a structure in which data is input to a linear feedback shift register (LFSR), and N previous values are stored in the register of the LFSR when i-th scrambled data is generated from an N-stage synchronizing scrambler.

Estimating the generator polynomial of the self-synchronizing scrambler is to estimate the generator polynomial coefficients, $C=(C_1 C_2 \ldots C_N)$, of the LFSR.

Here, S may denote a bit signal received from the communication unit 110, and may be represented by $S=(S_1 S_2 \ldots)$.

Furthermore, [Equation 1] may be derived using this.

$$s_i = m_i \oplus D_i \quad \text{[Equation 1]}$$

$$D_i = C \cdot (s_{i-1} s_{i-2} \ldots s_{i-N})$$
$$= [(c_1 s_{i-1}) \oplus (c_2 s_{i-2}) \oplus \ldots \oplus (c_N s_N)]$$

Here, $m_i$ denotes data modulated by a spreading code, $D_i$ denotes a generator polynomial, and N denotes an order of the generator polynomial of the LFSR.

In addition, if [Equation 1] is converted into a matrix, it may be represented by [Equation 2].

$$\begin{bmatrix} s_{i-1} & s_{i-2} & \ldots & s_{i-N} \\ s_i & s_{i-1} & \ldots & s_{i-N+1} \\ \vdots & \vdots & \ddots & \vdots \\ s_{i+N-2} & s_{i+N-3} & \ldots & s_{i-1} \end{bmatrix} \begin{bmatrix} c_1 \\ c_2 \\ \vdots \\ c_N \end{bmatrix} + \begin{bmatrix} m_i \\ m_{i+1} \\ \vdots \\ m_{i+N-1} \end{bmatrix} = \begin{bmatrix} s_i \\ s_{i+1} \\ \vdots \\ s_{i+N-1} \end{bmatrix} \quad \text{[Equation 2]}$$

$$\begin{bmatrix} s_{i-1} & s_{i-2} & \ldots & s_{i-N} \\ s_i & s_{i-1} & \ldots & s_{i-N+1} \\ \vdots & \vdots & \ddots & \vdots \\ s_{i+N-2} & s_{i+N-3} & \ldots & s_{i-1} \end{bmatrix} \begin{bmatrix} c_1 \\ c_2 \\ \vdots \\ c_N \end{bmatrix} = \begin{bmatrix} D_i \\ D_{i+1} \\ \vdots \\ D_{i+N-1} \end{bmatrix}$$

Hereafter, the first operation unit 120 performs a left shift operation on the bit signal S by the number of bits of a spreading code to generate a first operation stream (S<<B).

Here, B is a length of the spreading code.

Furthermore, the second operation unit 130 removes the spreading code by an XOR operation ($S \oplus (S \ll B)$) between the bit signal and the first operation stream ($S \ll B$) to generate a second operation stream (T).

The second operation stream (T=t0, t1, t2 . . . ) may be expressed as [Equation 3] below.

$$T = t_0\ t_1\ t_2\ \ldots \quad \text{[Equation 3]}$$
$$= (s_0 \oplus s_B) \| (s_1 \oplus s_{B+1}) \| (s_2 \oplus s_{B+2}) \| (s_3 \oplus s_{B+3}) \| \ldots$$
$$= (m_0 \oplus m_B \oplus D_0 \oplus D_B) \| (m_1 \oplus m_{B+1} \oplus D_1 \oplus D_{B+1}) \|$$
$$(m_2 \oplus m_{B+2} \oplus D_2 \oplus D_{B+2}) \| \ldots$$

Hereafter, the third operation unit 140 performs a left shift operation on the second operation stream (T) by one bit to generate a third operation stream (T<<1).

Although the bit shift is performed by 1 in the process of generating the is third operation stream (T<<1), the present disclosure is not limited thereto and the bit shift varies according to a user's setting.

Then, the fourth operation unit 150 removes the data by an XOR operation ($T \oplus (T \ll 1)$) between the second operation stream (T) and the third operation stream (T<<1) to generate a fourth operation stream ($U = u_0 u_1 u_2 \ldots$), and it may be expressed as [Equation 4].

$$u_i = \begin{cases} D_i \oplus D_{B+i} \oplus D_{i+1} \oplus D_{B+i+1} & \text{if } i \bmod B < B-1 \\ m_i \oplus m_{B+i} \oplus m_{i+1} \oplus m_{B+i+1} \oplus & \\ D_i \oplus D_{B+i} \oplus D_{i+1} \oplus D_{B+i+1} & \text{else} \end{cases} \quad \text{[Equation 4]}$$

If i mod B<B−1 in [Equation 4], the spreading code and the message are removed $m_i \oplus m_{B+i} \oplus m_{i+1} \oplus m_{B+i+1}$.

Therefore, $u_i$ consists of only $D_i$'s, with all messages and spreading codes removed in the remaining parts except for the last bit in each B-bit string.

Then, [Equation 5] may be derived by substituting $D_i = C \cdot (S_{i-1} S_{i-2} \ldots S_{i-n})$ in [Equation 1] into [Equation 4] in case where i mod B<B−1.

$$u_i = c_1(s_{2i-1-N} \oplus s_{2i-N} \oplus s_{2i+1-N} \oplus s_{2i+2-N}) \oplus \quad \text{[Equation 5]}$$
$$c_2(s_{2i-N} \oplus s_{2i+1-N} \oplus s_{2i+2-N} \oplus s_{2i-3-N}) \oplus \ldots \oplus$$
$$c_N(s_{2i-2} \oplus s_{2i-1} \oplus s_{2i} \oplus s_{2i+1})$$
$$= \bigoplus_{j=i}^{N} c_j u_{i-j} f \text{ or } i \bmod B < B - 1.$$

Subsequently, the polynomial generator 160 represents ui's as a simultaneous equation consisting of linear equations for $C=(C_1 C_2 \ldots C_N)$ using [Equation 5], and converts the simultaneous equation into a matrix, and applies a Gaussian elimination method to obtain the values of C.

Furthermore, the generator polynomial may be derived using the obtained C values to obtain the initial value of the scrambler.

Subsequently, the determination unit 170 decodes the bit signal using the derived generator polynomial, and extracts data included in the bit signal if is determined that the bit signal is decoded by the generator polynomial, and the operation is performed again from the process of generating the first operation stream with a different number of bits of the spreading code if determined that the bit signal is not decoded.

Since the length of a spreading code used for encoding is often unknown when receiving an unknown bit signal with encoded data, the process of obtaining a generator polynomial under the assumption that the length is unknown will be described for an example.

First, it will be described a case where a Walsh code is used as a spreading code.

Since the length of a Walsh code is unknown when the bit signal is received, the present disclosure should be carried out for Walsh codes of any length.

However, since the Walsh code has a length of $2^m$ due to the characteristics of Walsh, when a bit signal (S) spread to a Walsh code having a length of $2^m$ is given, bit shift is always performed in multiples of 2, and thus 2 is the unit of the minimum bit shift, and as a unit, the first operation stream may be generated by an operation of $S<<2^m$.

Accordingly, the second operation stream (T) may be generated by an to operation of $S\oplus(S<<2)$, and the generator polynomial and the initial value may be calculated regardless of the length of the Walsh code.

In addition, it will be described a case where a Barker code is used as a spreading code.

Likewise, when receiving an unknown bit signal, the length of the used is Barker code is not known, it should be applied to Barker codes of any length.

However, since the Barker code has 7 types of lengths 2, 3, 4, 5, 7, 11, and 13, it only needs to be performed 7 times.

In addition, since 2 is a divisor of 4, a Barker code of length 2 may generate the same generator polynomial and initial value as 4, and thus when the code is applied up to six times for lengths 3, 4, 5, 7, 11, and 13, a generator polynomial may be generated.

As described above, it has been described for an example under the premise that Walsh and Barker codes are used as spreading codes for an unknown bit signal, but the present disclosure is not limited thereto, and the features of the spreading code may be applied to repeatedly perform the present disclosure so as to derive a generator polynomial.

Additionally, even if the type of a spreading code used for encoding is not known, any one spreading code may be assumed, and then the feature of a length available for the spreading code may be applied to derive a generator polynomial.

Though described with reference to the foregoing embodiment, various modifications and improvements will become apparent to those skilled in the art without departing from the concept and scope of the present invention as defined in the following claims.

What is claimed is:

1. A data encoding method, the method comprising:
receiving a bit signal with encoded data;
performing a bit shift on the bit signal by a first length corresponding to a length of a spreading code used to encode the data so as to generate a first operation stream;
generating a second operation stream from which the spreading code is removed using the bit signal and the first operation stream;
performing a bit shift on the second operation stream by a second length to generate a third operation stream;
generating a fourth operation stream from which the data is removed using the second operation stream and the third operation stream; and
generating a generator polynomial capable of decoding the data encoded using the fourth operation stream.

2. The method of claim 1, further comprising:
decoding the bit signal using the generator polynomial, and determining whether or not it is decodable.

3. The method of claim 2, wherein said determining whether or not the bit signal is decodable performs generating the first operation stream if it is determined that the bit signal is undecodable by the generator polynomial.

4. The method of claim 1, wherein said generating first operation unit and said generating the third operation unit perform a bit shift through a left shift operator.

5. The method of claim 1, wherein the first length is any one of a plurality of lengths available for the spreading code, and
the second length is a natural number equal to or greater than 1.

6. The method of claim 1, wherein said generating the second operation stream performs an exclusive OR operation between the bit signal and the first operation stream to remove the spreading code, and
said generating the fourth operation stream performs an exclusive OR operation between the second operation stream and the third operation stream to remove the message.

* * * * *